(12) United States Patent
Miller

(10) Patent No.: US 6,239,606 B1
(45) Date of Patent: May 29, 2001

(54) METHOD TO PERFORM IDDQ TESTING IN THE PRESENCE OF HIGH BACKGROUND LEAKAGE CURRENT

(75) Inventor: Anthony C. Miller, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/163,592

(22) Filed: Sep. 29, 1998

Related U.S. Application Data

(62) Division of application No. 08/670,545, filed on Jun. 27, 1996, now Pat. No. 5,889,408.

(51) Int. Cl.$^7$ .................................................. G01R 31/28
(52) U.S. Cl. .............................................. 324/765; 324/763
(58) Field of Search .................................. 324/763, 765, 324/73.1, 158.1; 438/14, 17–18; 257/40, 48; 714/724, 733, 735, 736

(56) References Cited

U.S. PATENT DOCUMENTS

| | | | |
|---|---|---|---|
| 5,025,344 | 6/1991 | Maly et al. | 361/88 |
| 5,057,774 | 10/1991 | Verhelst et al. | 324/158 R |
| 5,332,973 | 7/1994 | Brown et al. | 324/537 |
| 5,371,457 | 12/1994 | Lipp | 324/158.1 |
| 5,392,293 | 2/1995 | Hsue | 371/15.1 |
| 5,519,333 | 5/1996 | Righter | 324/765 |

OTHER PUBLICATIONS

David G. Edwards, "Testing for MOS Integrated Circuit Failure Modes", IEEE Reprinted from Proceedings International Test Conference, 1980, pp. 303–312.

Thomas M. Storey, et al., "CMOS Bridging Fault Detection", IEEE Reprinted from Proceedings International Test Conference, 1990, pp. 325–334.

Robert C. Aitken, "A Comparison of Defect Models for Fault Location with IDDQ Measurements", IEEE, Reprinted from Proceedings International Test Conference, 1992, pp. 335–344.

Charles F. Hawkins, et al., "Electrical Characteristics and Testing Considerations for Gate Oxide Shorts in CMOS ICs", IEEE, Reprinted from Proceedings International Test Conference, 1985, pp 313–324.

*Primary Examiner*—Vinh P. Nguyen
(74) *Attorney, Agent, or Firm*—Blakely, Sokoloff, Taylor & Zafman LLP

(57) ABSTRACT

A method for IDDQ testing to detect defects in a semiconductor integrated circuit in the presence of a high background leakage current is disclosed. In one embodiment of the present invention at least a portion of the semiconductor device is biased and first, second and third quiescent currents are measured and the currents are then compared. A defect in the circuit will show up as a high quiescent current for one or more of the biasing conditions. In a practical device many test patterns are required, for instance 200 patterns may be necessary to reveal defects. Additionally, the delta in current which is sought to detect the defect may need to be repeated several times to assure its detection.

5 Claims, 6 Drawing Sheets

METHOD TO PERFORM IDDQ TESTING IN THE PRESENCE OF HIGH BACKGROUND LEAKAGE CURRENT

This application is a Division of Ser. No. 08/670,545, filed Jun. 27, 1996, and now Pat. No. 5,889,408.

BACKGROUND OF THE INVENTION

1. Field of the Invention

This invention relates to the field of testing semiconductor devices for defects, and more specifically, to a method for detecting defects in a semiconductor device using IDDQ testing in the presence of high background leakage current.

2. Background Information

In the manufacture of semiconductor devices it is important to have methods for testing a device, for example a transistor, and determining if it is a good device or if it contains defects before selling such a product to a customer. Some methods of testing a device for defects use a "modeling" system. In a modeling system there is at least one device which is presumably not defective. This non-defective model (model) is tested and the results are stored in a memory. Other devices which are like the model are then tested and the results of the tested devices are compared to the results of the model. If the results are the same or are within a manufacturer's tolerance levels (i.e. a manufacturer's acceptable ranges for deviation from the model) then the device is presumably a good or non-defective device and may be sold to a customer. If the results are not the same and are not within the manufacturer's tolerance levels then the device is a defective device and cannot be sold to a customer.

Another method for testing a device for defects is called IDDQ Testing. In a CMOS device when the clock is stopped, the device is said to be in a quiescent state, thus the current in the device is called drain to drain quiescent current (IDDQ). When the dock is running the device is said to be in active state, thus the current in the device is called drain to drain dynamic current (IDDD). In IDDQ testing, a device is tested by measuring the current while the device is in the quiescent state. Measuring the quiescent current allows defects such as open and short circuits to be detected. If the IDDQ is above a preset threshold, then the device is termed "defective" and is not sold to the customer.

Prior methods for IDDQ testing require a low background leakage current while in the quiescent state. In such prior methods, the background leakage current is typically in the range of a few hundred nanoamps (nA) to a few hundred microamps ($\mu$A). As is illustrated in FIG. 1, a statistical sample of devices under test (DUT) is taken in order to determine a median background leakage current 110. Once a median background leakage current is established then an IDDQ pass/fail limit 120 is set. The pass/fail limit must be set such that it is greater than the median background leakage current but such that it is less than the average current caused by a device defect. Typically in prior methods the pass/fail limit is set at a current much higher than the median, usually from three (3) to six (6) standard deviations greater than the median background leakage current. For example, the pass/fail limit may be in the range of approximately 500 microamps ($\mu$A) to 1.5 milliamps (mA). Any device exhibiting an IDDQ current greater than the pass/fail limit is a defective device 130 and is not sold to a customer.

One of the problems with prior art methods for IDDQ testing is that they can only detect defects where the defect causes an IDDQ current larger than the background leakage current. As device characteristics of semiconductors become smaller and more dense, the IDDQ current caused by defects becomes smaller than the background leakage current.

Because semiconductor devices are becoming smaller, so too are the dimensions of the components that make up those devices. Consequently, the channel lengths of such smaller devices also become very small or short. These shorter channel lengths lead to a substantial increase in the background leakage current. For example in submicron devices, background leakage currents in the range of approximately several tens of milliamps (mA) are likely due to the short channel lengths.

As is illustrated in FIG. 2, with smaller and more dense semiconductor devices a median background leakage current 210 which is on the order of tens of milliamps (mA) is larger than the typical pass/fail limit 220 which is on the order of several hundred microamps ($\mu$A). Thus a defect higher than the pass/fail limit 220 but smaller than the background leakage current 210 would go undetected. If the pass/fail limit was set three (3) to six (6) times the median 210, then the pass/fail limit would be so high that virtually all defects would go undetected, making this prior technique impractical. The defective devices in essence will not have a defect current large enough to distinguish itself from the median background leakage current 210 of the device.

Thus, what is needed is a method for detecting defects in a semiconductor device in the presence of a high background leakage current.

SUMMARY OF THE INVENTION

The present invention describes a method for IDDQ testing to detect defects in a semiconductor device in the presence of a high background leakage current. In one embodiment of the present invention at least a portion of a semiconductor device is biased and a first quiescent current measurement is taken. The portion of the semiconductor device that was biased is then unbiased and a second quiescent current measurement is taken. The first, second and third quiescent currents are then compared to determine if a defect exists in that portion of the semiconductor device.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A Method to Perform IDDQ Testing in the Presence of a High Background Leakage Current is disclosed. In the following description, numerous specific details are set forth such as specific materials, devices, process parameters, etc.

in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a method for performing IDDQ Testing to detect defects in a semiconductor device in the presence of a large background leakage current. As device characteristics of semiconductors become smaller and more dense, the background leakage of these devices becomes larger thus making testing the circuitry of such devices much harder. As stated in the background of the invention, it is important to have an accurate method for detecting defects in a semiconductor device such that "bad" or defective devices are not sold to a customer.

IDDQ Testing is performed when the clock of a semiconductor device is stopped. When the clock is stopped, the device is said to be in a quiescent state and the current in the device is called the drain to drain quiescent current (IDDQ). It should be noted that IDDQ Testing is usually performed during functional pattern testing of the device. Functional pattern testing is well known in the art and is generally used to test particular portions of a semiconductor device usually in accordance with the pattern (or format) of the circuitry layout of the device. Functional patterns are used to place the device or portions of the device into different states to activate any defects that may be present.

In the present invention, rather than setting a hard pass/fail limit as with prior methods for IDDQ testing, the pass/fail limit is set by the first measurement of the quiescent current for the device under test (DUT) or portion of the device. In other words, the first quiescent current (IDDQ) measurement is stored and is the measurement that subsequent quiescent current (IDDQ) measurements are compared to in determining if a defect exists within the semiconductor device. Once a first IDDQ measurement is taken and stored then subsequent IDDQ measurements are taken and compared to the stored (first) IDDQ measurement It should be noted that the terms "biased" and "unbiased" are used throughout the following detailed description. The terms "biased" and "unbiased" are used to describe the process of applying a voltage potential across defects that may be present in a device. Applying a voltage to a defect changes the state of the defect to either an on-state or an off-state, thereby allowing the defect to be detected or not detected, respectively. Biasing and/or unbiasing the defect is described in greater detail below.

Figure 1:
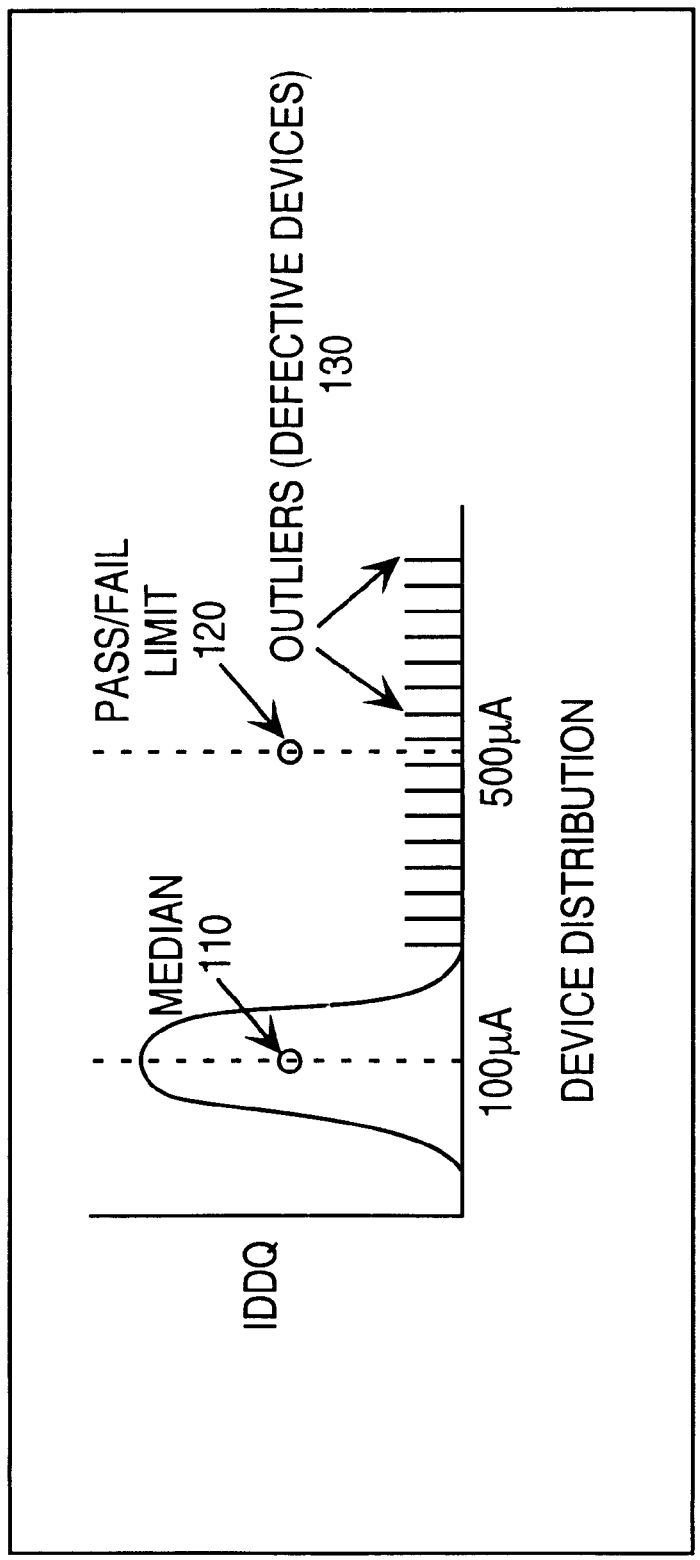
FIG. 1 illustrates a prior technique for detecting defects in a semiconductor device.
Figure 2:
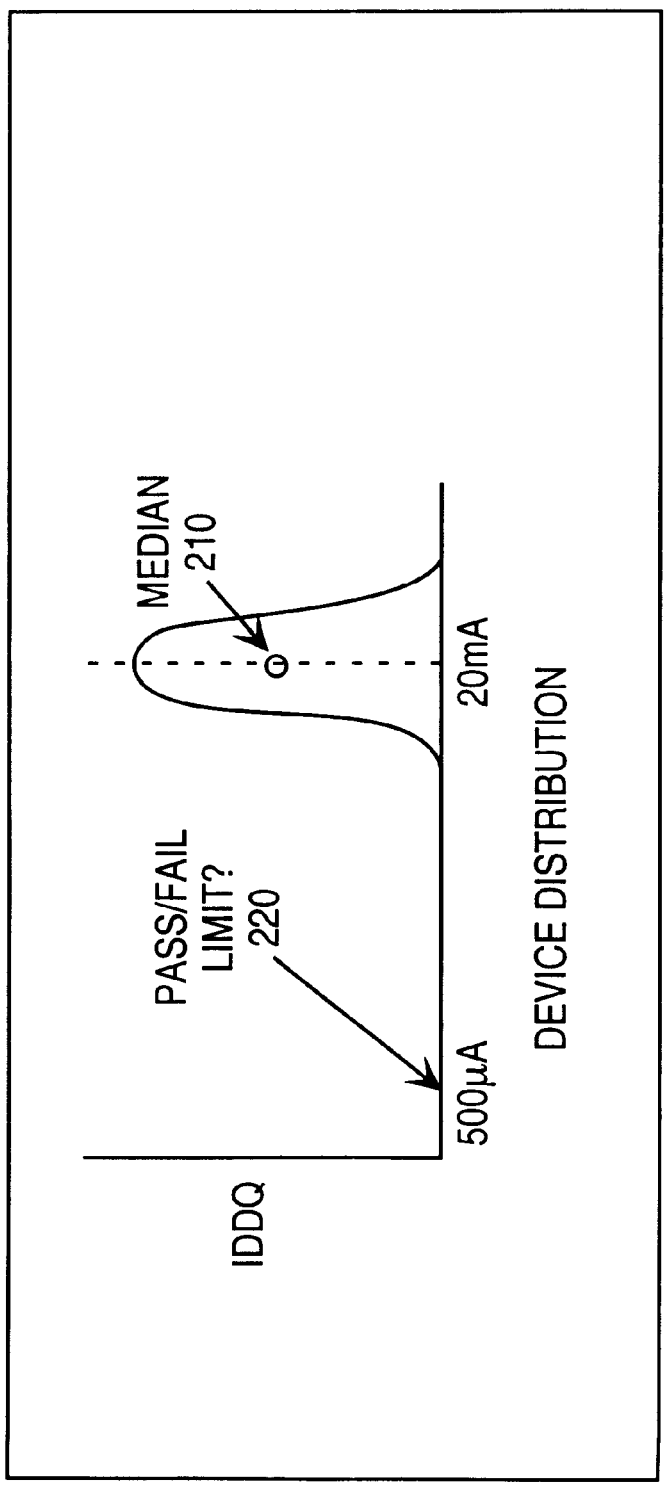
FIG. 2 illustrates the prior technique illustrated in FIG. 1 for detecting defects in submicron semiconductor devices.
Figure 3:
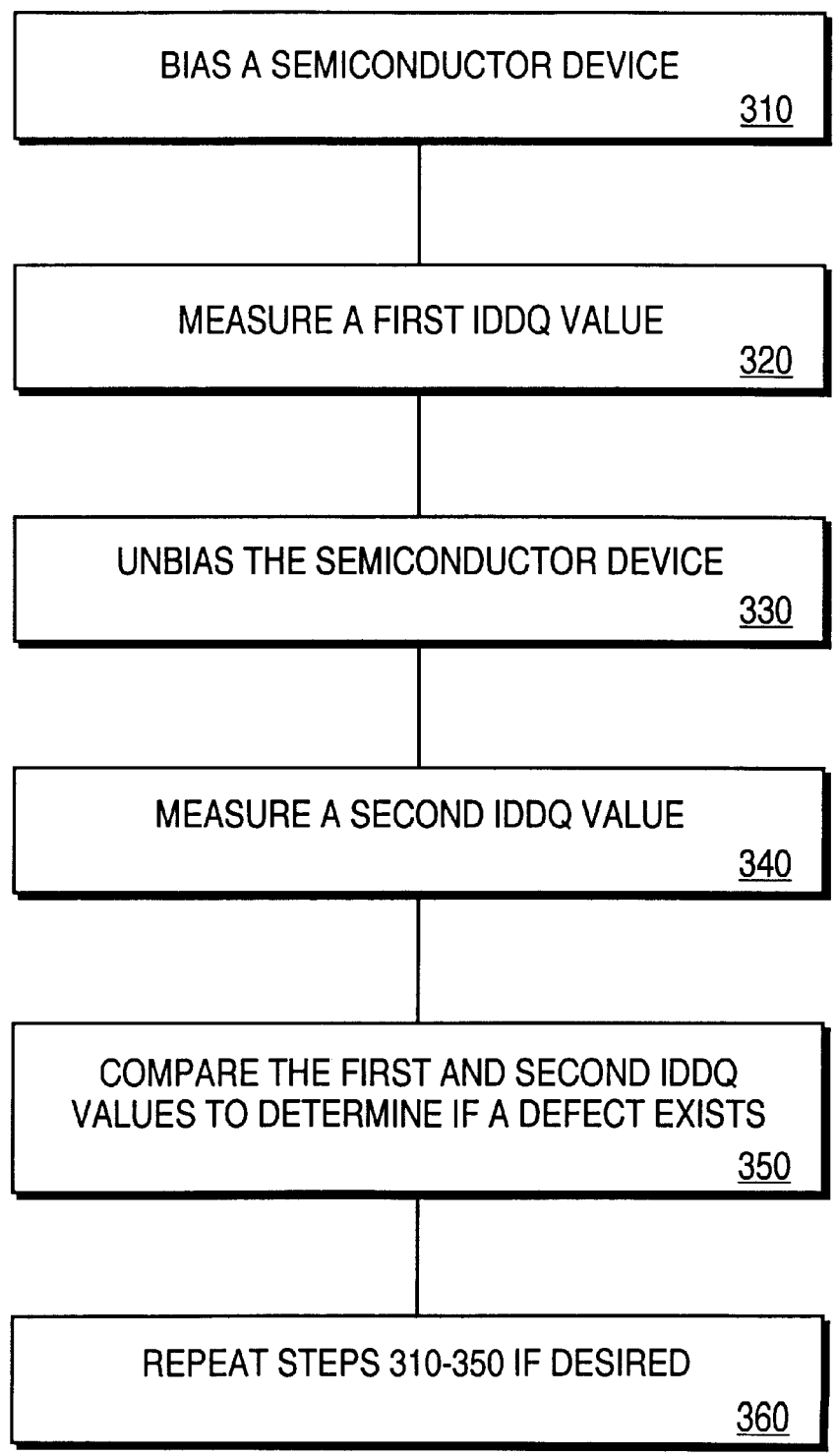
FIG. 3 illustrates a flow chart of one embodiment of the present invention.

FIG. 3 illustrates a flow chart of one embodiment of the present invention. At step 310, a semiconductor device, or a portion thereof, is biased. A first IDDQ measurement is then taken at step 320. At step 330, the semiconductor device, or portion thereof, is unbiased. Then at step 340 a second IDDQ measurement is taken. At step 350, the first IDDQ measurement and the second IDDQ measurements are compared. If it is found that a delta exists between the first IDDQ measurement and the second IDDQ measurement then a defect exists in the semiconductor device, or the portion thereof, that is being tested. At step 360, steps 310 through 350 may be repeated as many times for the same semiconductor device or portion thereof or for any semiconductor device or other portion thereof. In this embodiment only two IDDQ measurements are taken, in order to illustrate the general concept of the invention. However, one with ordinary skill in the art will appreciate that as many IDDQ measurements as desired may be taken. The embodiment illustrated in FIG. 3 and other embodiments of the present invention are discussed in greater detail below.

The IDDQ measurements will contain one or two components of current. One component of the IDDQ measurements is the background leakage current of the device. It should be noted and it will be appreciated by one skilled in the art, that tie background leakage current is dependent upon the temperature and voltage of the device. Thus, for any given device the background leakage current will remain fairly constant provided that the voltage and temperature remain constant. In the present invention it is desirable to keep the background leakage current constant so that the only change in the IDDQ measurement is attributable to a defect current. In order to maintain this repeatability, a constant voltage is used. The temperature under which the device is tested should also remain constant, however, as the device is biased and/or unbiased the device may heat up and cause an internal change in temperature. If this occurs, the test should be recalibrated by taking a new IDDQ measurement and storing that measurement as the sample IDDQ measurement and all subsequent measurements should be compared to this new stored value.

The IDDQ measurements may also contain a component of current caused by a defect or "defect current". Because the current caused by the defect cannot be distinguished from the background leakage current it cannot be determined from a single IDDQ measurement whether the semiconductor device contains a defect. Thus, at least a second IDDQ measurement of the DUT is taken (at the same operating voltage and temperature) in order to determine if there is a difference (or delta) between the IDDQ measurements. It is the delta between the two, or more IDDQ measurements that is used to determine if a defect exists within the semiconductor device.

If a defect exists it is necessary to bias this defect, in order to cause a defect current to show up, during at least one IDDQ measurement and it is necessary to unbias this defect during at least one IDDQ measurement in order to keep the defect current from showing up. In other words, in order to cause a difference in the current measurement it is necessary to bias the defect (if one exists) in an on-state for at least one measurement and bias the defect in an off-state (i.e. unbiased) for at least one measurement. In the on-state (biased) the defect will show up and cause a defect current to be present during the IDDQ measurement In the off-state (unbiased) the defect will not show up and will not cause a defect current during the IDDQ measurement. Thus, when the two measurements are compared a delta will be found between the measurements and it will be known that a defect exists.

Figure 4A:
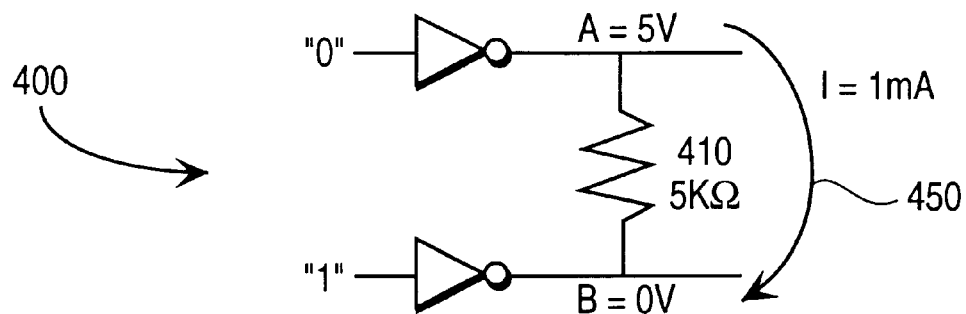
FIGS. 4*a* and 4*b* illustrate defect biasing as used in one embodiment of the present invention.
Figure 4B:
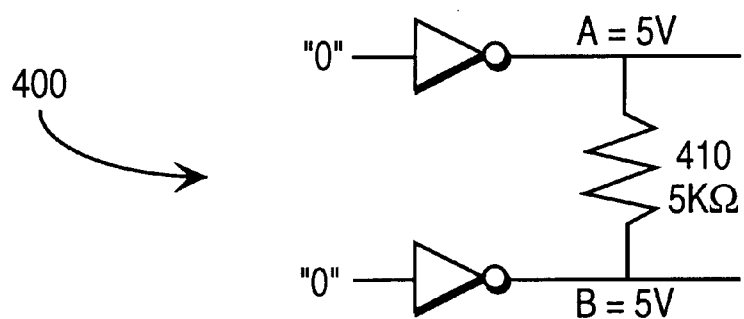

FIGS. 4a and 4b illustrate an example of defect biasing for a bridge defect. Circuit 400 in FIG. 4a contains bridge defect 410 between node A and node B. FIG. 4a illustrates circuit 400 biased to an on-state, such that the voltage at node A is approximately 5 volts and the voltage at node B is approximately 0 volts. Because circuit 400 is biased in an on-state a current 450 flows between node A and node B. Current 450 is the defect current.

FIG. 4b illustrates circuit 400 biased to an off-state (unbiased), such that the voltage at node A is approximately 5 volts and the voltage at node B is approximately 5 volts. Because circuit 400 is unbiased no current flows between node A and node B. The IDDQ measurement taken while circuit 400 is biased would be larger than the IDDQ measurement taken while circuit 400 is unbiased. Thus, the delta between the two measurements would indicate that a defect exists in circuit 400.

It should be noted and will be appreciated by one with ordinary skill in the art that circuit 400 illustrated in FIG. 4 is a very simple circuit and is used for illustrative purposes only. In actual practice semiconductor devices contain very complex circuits and circuit patterns which will require much more state conditioning. To condition a device such that all potential defects (i.e. bridges, etc.) are either both biased and unbiased at some point during testing will require that many test patterns be applied and that many IDDQ measurements be taken. For example, 200 IDDQ measurements may be necessary to test a large complex semiconductor device for defects.

The present invention activates and deactivates (biased and unbiased) a resident defect within a semiconductor device, thereby causing the IDDQ current to change accordingly. In the example illustrated in FIGS. 4a and 4b the current attributed to the defect is approximately 1 mA. So, for example, if the background leakage current of the device is approximately 20 mA, the IDDQ measurements during biasing and unbiasing display a delta of approximately 1 mA. This delta in the current is detectable and is used to determine whether the DUT is defective. If the delta limit is set at approximately ±500 µA as a pass/fail criteria, then the 1 mA delta in the example given above exceeds the failure limit, thus the device is labeled as defective and is not sold to a customer.

Figure 5:
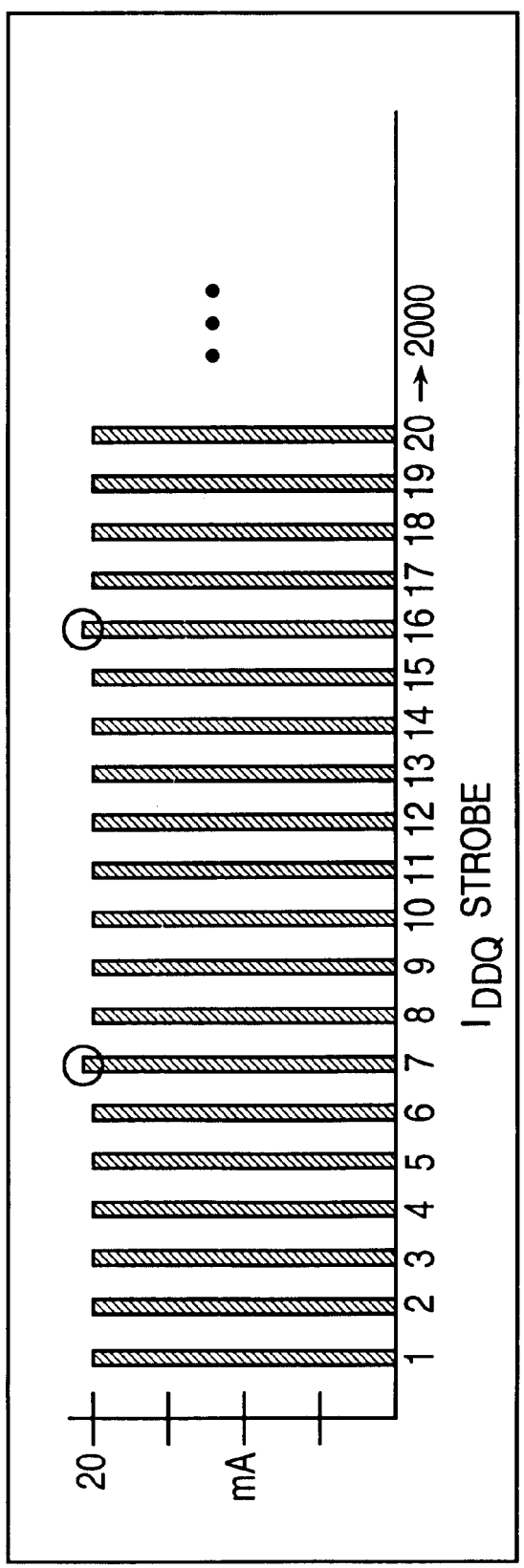
FIG. 5 illustrates a quiescent current histogram used in one embodiment of the present invention.

FIG. 5 illustrates a quiescent current histogram for the example given above with respect to FIGS. 4a and 4b. As is shown in FIG. 5 several IDDQ measurements were made during testing of a semiconductor device. The first IDDQ measurement was taken and indicates an IDDQ of approximately 20 mA. In accordance with one embodiment of the present invention, this first IDDQ measurement is stored as the sample IDDQ measurement and is the measurement to which all subsequent IDDQ measurements are compared. As is illustrated in FIG. 5, subsequent IDDQ measurements continue to show a 20 mA quiescent current up until the seventh IDDQ measurement. On the seventh measurement, the measured quiescent current is approximately 21 mA, thus the delta between the seventh IDDQ measurement and the first IDDQ measurement is approximately 1 mA (i.e. 120 mA–21 mA1=1 mA) which is the amount of current attributable to the defect. Because 1 mA exceeds the pass/fail limit of ±500 µA the device is labeled "bad" or defective.

It should be noted and one with ordinary skill in the art will appreciate that in the example given above, at the seventh IDDQ measurement the bridge defect (shown in FIG. 4a) is biased thus adding the second "defect" current component to the IDDQ measurement. It should also be noted that the defect may show in an earlier (or later) measurement depending upon the particular biasing pattern being used for a particular device. As stated earlier, in complex devices it may take hundreds of measurements before a defect is biased (or unbiased, as the case may be) before a delta is discovered.

Additionally, with respect to FIG. 5, the a delta is also detected on the sixteenth (16th) IDDQ measurement. It should be noted and it will be appreciated by one with ordinary skill in the art, that in actual practice to increase throughput of the tester it may be advantageous for the test program to stop on the first occurrence of a "failure" (i.e. detection of a defect). Although, it may also be found to be advantageous to fail only those devices wherein a defect is detected two or more times, in the event that the first detection was an error or is not repeatable. In the absence of a defect, the IDDQ measurement should remain stable (i.e. repeatable or consistent). In the event where there is not defect, the tester will run through as many measurements as desired by a particular user and when no delta is detected the device will be labeled "good" and may be sold to a customer.

Figure 6:
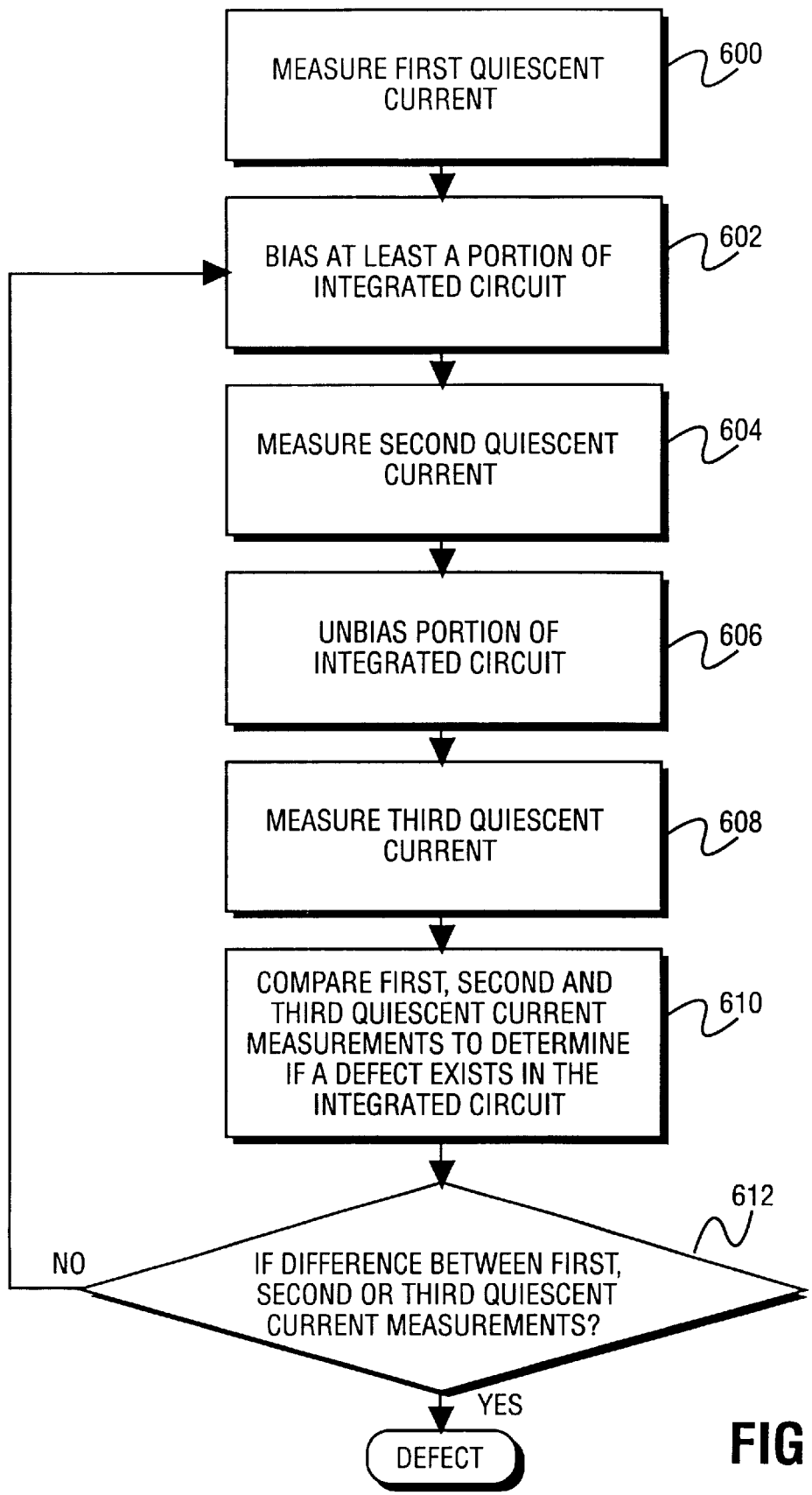
FIG. 6 illustrates a flow chart of another embodiment of the present invention.

In another embodiment shown in FIG. 6, the method of the present invention includes measuring three quiescent currents. A first quiescent current is measured (step 600) and then at least a portion of the integrated circuit is biased (step 602). Then a second quiescent current is measured (step 604). The portion of the chip is unbiased (step 606) and a third quiescent is measured (608). As mentioned earlier, in a complex chip it may be necessary to use hundreds of patterns to do all the biasing necessary to uncover defects. A comparison is made between the first, second and third quiescent currents to determine if a defect exists as described above (step 610). If there is no difference between the first, second and third quiescent currents, the steps are repeated for substantially all portions of the integrated circuit (step 612).

Thus, a Method to Perform IDDQ Testing in the Presence of a High Background Leakage Current has been described. Although specific embodiments, including specific examples, materials, devices, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for testing an integrated circuit to detect defects comprising the steps of:
   a) measuring a first quiescent current;
   b) biasing at least a portion of said integrated circuit;
   c) measuring a second quiescent current;
   d) unbiasing said portion of said integrated circuit;
   e) measuring a third quiescent current;
   f) comparing said first, second, and third quiescent current measurements to determine if a defect exists in said integrated circuit; and
   g) if there is no difference between said first, second, and third quiescent current measurements, repeating steps b) through f) for substantially all of said portions of said integrated circuit.

2. The method as described in claim 1 wherein a temperature and a voltage of said integrated circuit remains constant during defect detection.

3. The method as described in claim 1 wherein steps a) through g) are repeated if the temperature of said integrated circuit changes.

4. The method as described in claim 1 wherein said method further comprises the step of:
   h) if there is a difference between said first, second, and third quiescent current measurements, stopping said test.

5. The method as described in claim 1 wherein said step of determining if a defect exists in said integrated circuit comprises:
   i) comparing said first and second quiescent current measurements;
   j) comparing said first and third quiescent current measurements;
   k) if a difference in quiescent current in either of steps i) or j) then a defect is detected and stopping said test;
   l) if no difference in quiescent current is detected in both of steps i) and j) then no defect is detected in said portion of said integrated circuit.

* * * * *

UNITED STATES PATENT AND TRADEMARK OFFICE
CERTIFICATE OF CORRECTION

PATENT NO. : 6,239,606 B1
DATED : May 29, 2001
INVENTOR(S) : Miller et al.

It is certified that error appears in the above-identified patent and that said Letters Patent is hereby corrected as shown below:

Column 1,
Line 37, delete "dock", insert -- clock --.

Column 4,
Line 8, delete "tie", insert -- the --.

Signed and Sealed this

Second Day of July, 2002

Attest:

JAMES E. ROGAN
Attesting Officer  Director of the United States Patent and Trademark Office